(12) United States Patent
Fukuda

(10) Patent No.: US 7,362,159 B2
(45) Date of Patent: Apr. 22, 2008

(54) SEMICONDUCTOR INTEGRATED CIRCUIT

(75) Inventor: Ryo Fukuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 101 days.

(21) Appl. No.: 11/272,872

(22) Filed: Nov. 15, 2005

(65) Prior Publication Data

US 2006/0114052 A1 Jun. 1, 2006

(30) Foreign Application Priority Data

Nov. 16, 2004 (JP) ............................. 2004-331967

(51) Int. Cl.
*H01H 37/76* (2006.01)
*H01H 85/00* (2006.01)

(52) U.S. Cl. .................................... 327/525

(58) Field of Classification Search ................ 327/525, 327/526; 365/225.7
See application file for complete search history.

(56) References Cited

U.S. PATENT DOCUMENTS

| | | | |
|---|---|---|---|
| 5,140,554 A * | 8/1992 | Schreck et al. ............. | 365/201 |
| 6,310,806 B1 * | 10/2001 | Higashi et al. ............. | 365/200 |
| 6,498,756 B2 * | 12/2002 | Lee ............................ | 365/200 |
| 6,559,708 B2 * | 5/2003 | Notani ....................... | 327/537 |
| 6,717,871 B2 | 4/2004 | Takase ....................... | 365/200 |
| 2005/0073345 A1 * | 4/2005 | Schneider .................. | 327/185 |

FOREIGN PATENT DOCUMENTS

| | | |
|---|---|---|
| JP | 7-211779 | 8/1995 |
| JP | 11-90659 | 4/1999 |
| JP | 2001-57388 | 2/2001 |

* cited by examiner

*Primary Examiner*—Quan Tra
(74) *Attorney, Agent, or Firm*—Oblon, Spivak, McClelland, Maier & Neustadt, P.C.

(57) ABSTRACT

There is here disclosed a semiconductor integrated circuit comprising a laser beam irradiation object having one end portion at which a first potential is applied, a first transistor has a source and a drain wherein one of the source and the drain to which the other end portion of the object is electrically connected, a second transistor has a source and a drain wherein one of the source and the drain of the first transistor to which the other end portion is not electrically connected is electrically connected, and a storage circuit which is electrically connected to the one of the source and the drain of the second transistor to which the first transistor is electrically connected, and which is additionally electrically connected to the one of the source and the drain of the first transistor to which the other end portion is not electrically connected.

30 Claims, 5 Drawing Sheets

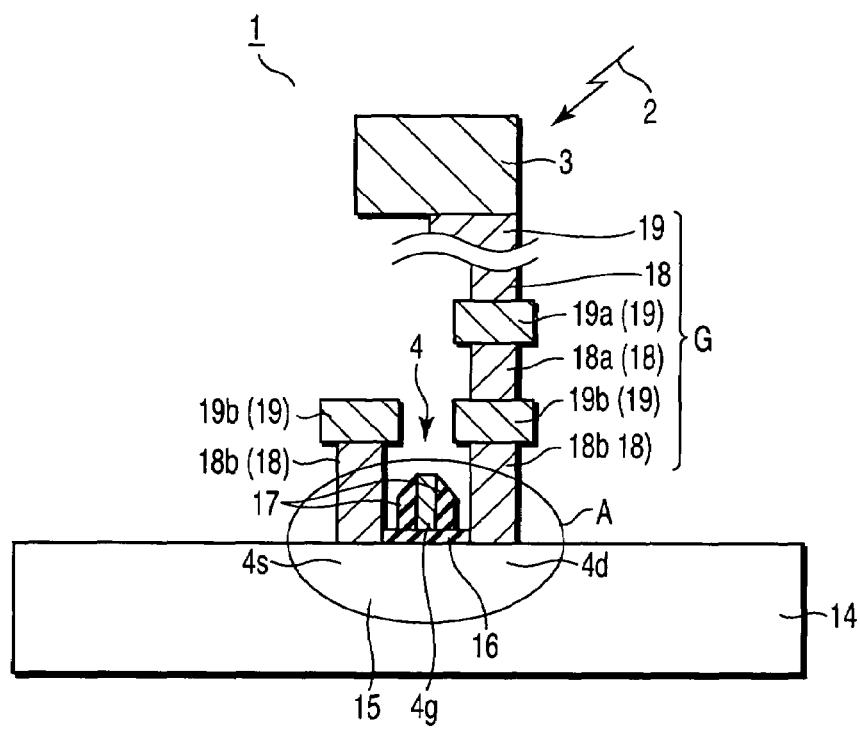
F I G. 3
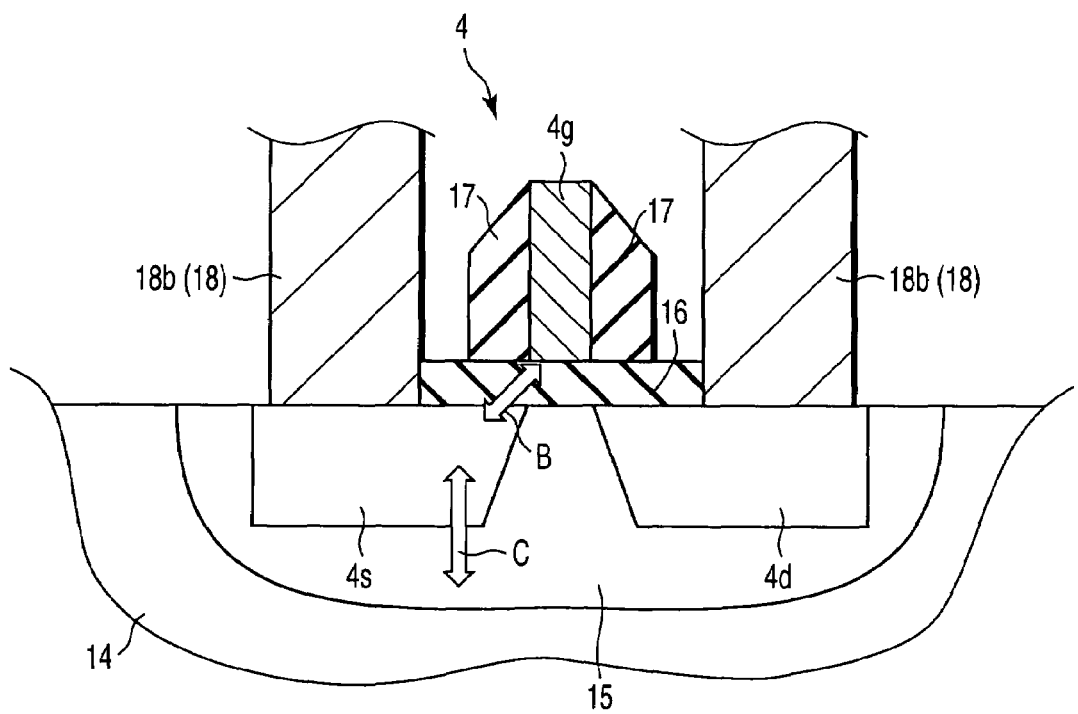
F I G. 4

SEMICONDUCTOR INTEGRATED CIRCUIT

CROSS-REFERENCE TO RELATED APPLICATIONS

This application is based upon and claims the benefit of priority from prior Japanese Patent Application No. 2004-331967, filed Nov. 16, 2004, the entire contents of which are incorporated herein by reference.

BACKGROUND OF THE INVENTION

1. Field of the Invention

The present invention relates generally to a semiconductor integrated circuit having a fuse. More particularly, the invention relates to a semiconductor integrated circuit that, even when components such as circuits and elements near a fuse are damaged during fuse blowing, is capable of exhibiting an appropriate function equivalent to that obtainable in the event of appropriate fuse blowing.

2. Description of the Related Art

In recent years, a semiconductor integrated circuit uses nonvolatile memory devices each containing a fuse and the like and programs the memory devices, thereby to set redundant-memory replacement data, operation modes, and the like. In addition, recently, by way of a mainstream programming method, a fuse formed of a metal or the like is irradiated with a laser beam to be vaporized, whereby the conduction in a fuse portion is cut off. That is, a so-called "laser fuse method" for performing fuse-blowing programming is a recent mainstream programming method. Such techniques are disclosed in, for example, Jpn. Pat. Appln. KOKAI Publication Nos. 7-211779, 11-90659 and 2001-57388.

In recent years, techniques such as high integration and micro-fabrication of semiconductor integrated circuits are noticeable. Under such circumstances, in a circuit requiring programming to be performed according to the laser fuse method using an ordinary laser beam is constructed, there is a high risk that the circuit does not appropriately operate because of fuse blowing. More specifically, suppose a gate and the like of a transistor provided near a lower layer of the fuse are caused to shrink (reduced in size or miniaturized). In this case, a laser beam energy occurring at fuse blowing causes an oxide film, diffusion layer, and the like of the transistor to easily break. With such the oxide film or diffusion layer of the transistor being broken, the transistor accordingly is caused not to appropriately operate. This can potentially cause the entirety of the semiconductor integrated circuit not to appropriately operate.

BRIEF SUMMARY OF THE INVENTION

According to an aspect of the invention, there is provided a semiconductor integrated circuit comprising: a laser beam irradiation object provided above a substrate, the laser beam irradiation object having one end portion at which a first potential is applied, and having conduction being cut off upon irradiation with a laser beam; a first transistor which is provided on the substrate and has a source and a drain wherein one of the source and the drain to which the other end portion of the laser beam irradiation object is electrically connected, the first transistor being supplied with a second potential as a back bias which is different from the first potential, and having a channel formed of a first conductive type; a second transistor which has a source and a drain wherein one of the source and the drain of the first transistor to which the other end portion of the laser beam irradiation object is not electrically connected is electrically connected to one of the source and the drain of the second transistor and the second potential is supplied to the other one of the source and the drain of the second transistor, the second transistor being supplied with the second potential as a back bias, and having a channel formed of the first conductive type; and a storage circuit which is electrically connected to the one of the source and the drain of the second transistor to which the first transistor is electrically connected, and which is additionally electrically connected to the one of the source and the drain of the first transistor to which the other end portion of the laser beam irradiation object is not electrically connected.

BRIEF DESCRIPTION OF THE SEVERAL VIEWS OF THE DRAWING

FIG. 3 is a cross-sectional view of a peripheral portion of a fuse of the semiconductor integrated circuit shown in FIG. 1;

FIG. 4 is an enlarged view of a portion surrounded by a circle A in FIG. 3;

DETAILED DESCRIPTION OF THE INVENTION

Embodiments of the present invention will be individually described below with reference to the accompanying drawings.

First Embodiments

Figure 7:
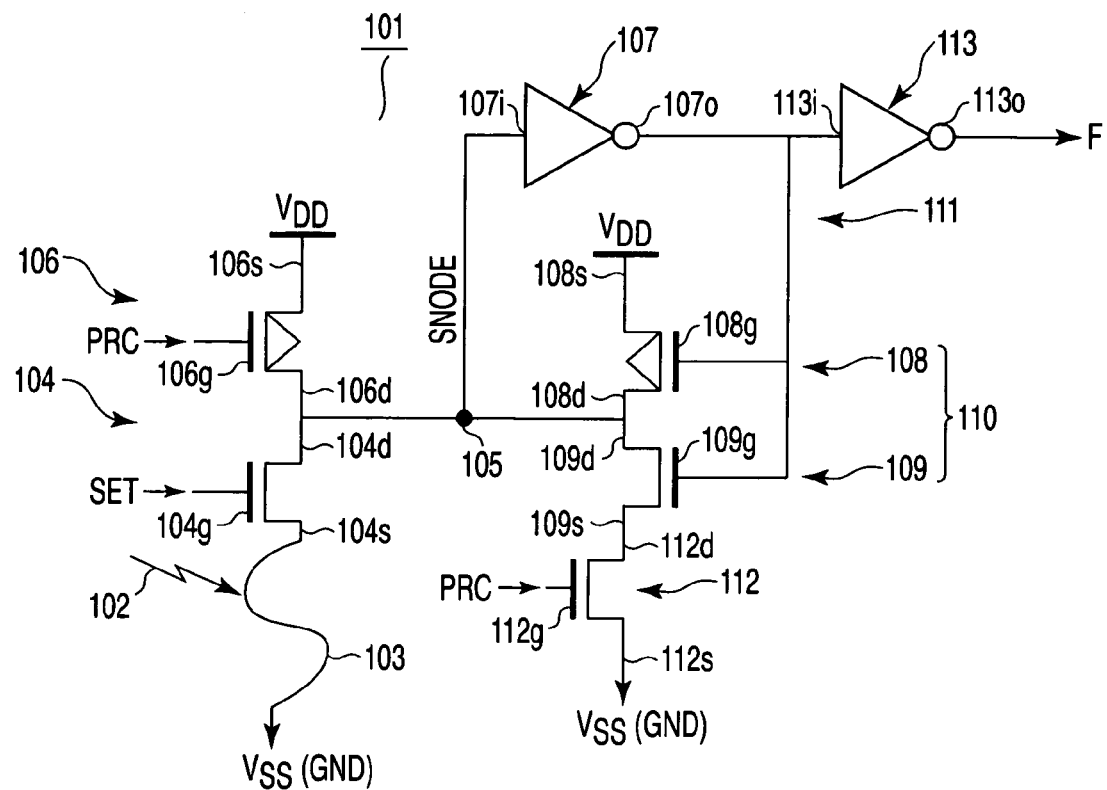
FIG. 7 is a schematic view of a semiconductor integrated circuit according to a prior art, shown as a comparative example with respect to the first embodiment.
Figure 8:
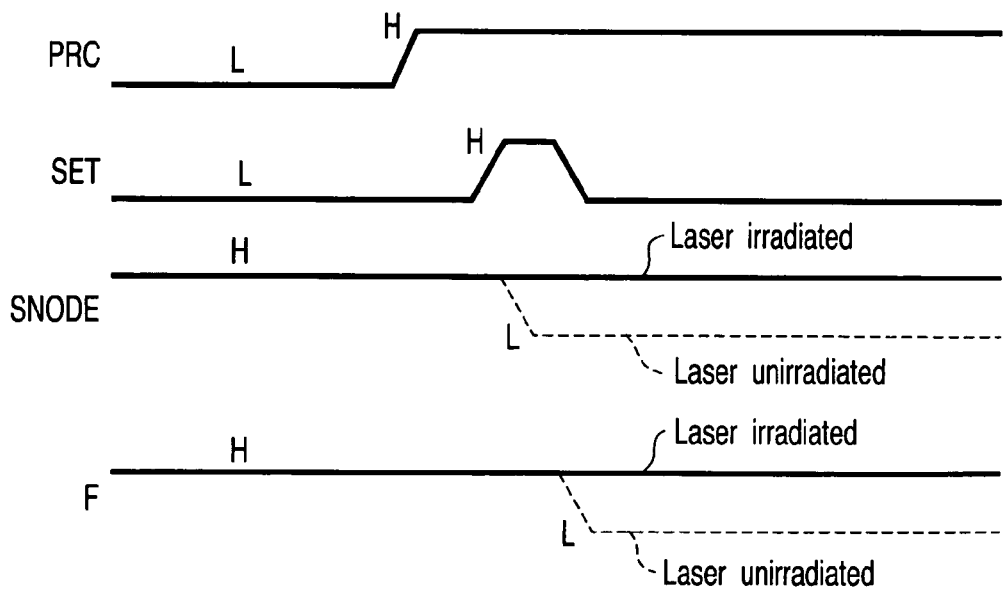
FIG. 8 is a view showing operation waveforms in the semiconductor integrated circuit shown in FIG. 7.

Prior to description of the present embodiment, a prior art will be described herebelow with reference to FIGS. 7 and 8 as a comparative example with respect to the present embodiment. FIG. 7 is a schematic view of a semiconductor integrated circuit according to the prior art, shown as a comparative example with respect to the present embodiment. FIG. 8 is a view showing operation waveforms in the semiconductor integrated circuit shown in FIG. 7.

Firstly, a circuit configuration of a semiconductor integrated circuit 101 shown in FIG. 7 will be described here. The semiconductor integrated circuit 101 has a circuit configuration that implements a ROM function by programming according to a laser-fuse method ("laser-fuse programming", hereafter). The circuit configuration will be described in more detail below.

With reference to FIG. 7, a fuse metal 103 provided as a laser beam irradiation metal to be irradiated with a laser beam 102 is arranged such that one end thereof is electrically connected to a source 104s of a SET N-channel transistor 104. In addition, the other end of the fuse metal 103 is electrically connected to $V_{SS}$ (grounded). The fuse metal 103 is irradiated with the laser beam 102 thereby to be vaporized, whereby the conduction of the fuse metal 103 is cut off. More specifically, the semiconductor integrated circuit 101 (ROM) is programmed in the manner that the fuse metal 103 is blown ("fuse-blown", hereafter), thereby to implement a predetermined ROM function. An SNODE 105 is formed of a node indicative of the state of the programmed fuse metal 103. The SNODE 105 is electrically connected to a drain 104d of the SET N-channel transistor 104. A set signal SET is input at a gate 104g of the SET N-channel transistor 104. Thereby, if the fuse metal 103 is not irradiated the laser beam 102, when SET is activated to "H", the SNODE 105 is drawn (set) to "L".

The SNODE 105 is additionally electrically connected to a drain 106d of a precharging P-channel transistor 106. The drain 104d of the SET N-channel transistor 104 is additionally electrically connected to the drain 106d of the precharging P-channel transistor 106. A source 106s of the precharging P-channel transistor 106 is electrically connected to $V_{DD}$ (power source potential), thereby forming a $V_{DD}$ power source node. A precharge signal PRC is input at a gate 106g of the precharging P-channel transistor 106. The precharging P-channel transistor 106 is provided to precharge the SNODE 105. With the precharging P-channel transistor 106, when PRC is activated to "L", the SNODE 105 is set to "H", that is, the precharge state.

The SNODE 105 is additionally electrically connected to an input 107i of an inverter 107. An output 107o of the inverter 107 is electrically connected to a gate 108g of a latch-feedback P-channel transistor 108 and to a gate 109g of a latch-feedback N-channel transistor 109. There are electrically interconnected between the drain 108d of the latch-feedback P-channel transistor 108 and the drain 109d of the latch-feedback N-channel transistor 109. The latch-feedback P-channel transistor 108 and the latch-feedback N-channel transistor 109 together constitute a CMOS inverter 110, which is configured of a PMOS transistor and a NMOS transistor being electrically interconnected.

Similar to the respective drains 104d and 106d of the setting N-channel and precharging P-channel transistors 104 and 106, the respective drains 108d and 109d of the latch-feedback P-channel and N-channel transistors 108 and 109 are electrically connected to the SNODE 105. Namely, the inverter 107, the latch-feedback P-channel transistor 108, and the latch-feedback N-channel transistor 109 together form a latch circuit 111 through the SNODE 105. Thereby, even when both SET and PRC are in inactive states, the latch-feedback P-channel transistor 108 and the latch-feedback N-channel transistor 109 can play the role of fixing (holding) the SNODE 105 to the precharge state or a set state. Accordingly, even when SET is "L" and PRC is "H", the latch-feedback P-channel transistor 108 and the latch-feedback N-channel transistor 109 can fix the SNODE 105 to "H" or "L".

A source 108s of the latch-feedback P-channel transistor 108 is electrically connected to the $V_{DD}$ (power source potential). A source 109s of the latch-feedback N-channel transistor 109 is electrically connected to a drain 112d of an N-channel transistor 112 which is different from the SET N-channel transistor 104. The precharge signal PRC is input at a gate 112g of the N-channel transistor 112. A source 112s of the N-channel transistor 112 is electrically connected to $V_{SS}$ (grounded). The N-channel transistor 112 is provided to function such that while PRC is activated and the SNODE 105 is being precharged, the latch-feedback N-channel transistor 109 is invalidated thereby to restrain a leakage current from flowing to the SNODE 105. Accordingly, while PRC is "L" and the SNODE 105 is "H", the N-channel transistor 112 functions to invalidate the latch-feedback N-channel transistor 109, thereby reducing the leakage current that flows to the SNODE 105.

In addition, the output 107o of the inverter 107 electrically connected to an input 113i of another inverter 113 provided in an outer portion of the latch circuit 111. A potential on the side of an output 113o of the inverter 113 serves as an F node indicative of an output value of the semiconductor integrated circuit 101 (ROM) wherein the fuse metal 103 is programmed by being fuse-blown. Similar to the SNODE 105, the F node is "H" when the fuse metal 103 is cut, and it becomes "L" when the fuse metal 103 is intact or uncut. Although not shown in the drawing, in the semiconductor integrated circuit 101, $V_{SS}$ is fed to individual back biases of the N-channel transistors 104, 109, and 112, and $V_{DD}$ is fed to individual back biases of the P-channel transistors 106 and 108.

Operation of the semiconductor integrated circuit 101 (ROM) will be described hereunder with reference to FIG. 8. FIG. 8 shows operation waveforms of the individual PRC, SET, SNODE 105, and F node of the semiconductor integrated circuit 101. As shown in FIG. 8, in an initial state, PRC is in the active state "L", and SET is in the inactive state "H". Concurrently, in the initial state, since the precharging P-channel transistor 106 is in the active state, the SNODE 105 is in the precharge state "H". Similarly, also the F node is "H". Subsequently, PRC is turned from the active state "L" to the inactive state "H". In this state, the SNODE 105 and the F node are not changed in state, and both remain at "H". Thereafter, SET is temporarily activated to turn from the inactive state "L" to the active state "H".

When SET is temporarily turned to "H", the SET N-channel transistor 104 is activated. However, when the fuse metal 103 is pre-blown, since a path (conduction path) connecting from the SNODE 105 to $V_{SS}$ is not present, the SNODE 105 is electrically connected with high resistance to $V_{SS}$ through, for example, an insulating film (not shown). Concurrently, in this state, the latch-feedback dedicated P-channel transistor 108 also is in the active state. Consequently, as shown in FIG. 8, even when SET either is staying at "H" or has returned from "H" to "L", the SNODE 105 is kept to remain at "H". Accordingly, also the F node is kept to all-time remain at "H", regardless of the operation states of, for example, PRC and SET.

In the event that SET is temporarily turned to "H", when the fuse metal 103 is not pre-blown, the SNODE 105 is electrically connected to $V_{SS}$ through the SET N-channel transistor 104 and the fuse metal 103. The resistance of a path extending from the SNODE 105 to $V_{SS}$ through the SET N-channel transistor 104 and the fuse metal 103 is preset lower than the resistance of a path extending from the SNODE 105 to the drain 108d of the latch-feedback P-channel transistor 108. The conductive state of the path extending from the SNODE 105 to $V_{SS}$ wins (takes precedence over) the conductive state of the path extending from the SNODE 105 to the latch-feedback P-channel transistor 108. As a consequence, as shown by the broken line in FIG. 8, when SET turns to "H" from "L", the SNODE 105 accordingly is drawn from to "L" from "H" (changed). Then, even after SET has returned to "L" from "H", the SNODE 105 is kept at "L". The F node also is drawn (changed) from to "L" from "H" after, as shown by the broken line in FIG. 8, the SNODE 105 has been drawn to "L". Similar to the SNODE 105, the F node is kept at "L" even after SET has returned to "L" from "H".

Thus, when the fuse metal 103 is in the blown state, both the SNODE 105 and the F node become "H". On the other hand, when the fuse metal 103 is in the unblown state, both the SNODE 105 and the F node become "L". Namely, the semiconductor integrated circuit 101, which is shown in FIG. 7, can implement the function as the ROM (nonvolatile memory).

However, when the SET N-channel transistor 104 is damaged or broken by the laser beam 102 in fuse blowing, the semiconductor integrated circuit 101 having the circuit configuration shown in FIG. 7 cannot exhibit the preset ROM function. For example, when the SET N-channel transistor 104 is damaged during fuse blowing, the processing of the semiconductor integrated circuit 101 outputs a value different from a preset output value in response to a predetermined input value. More specifically, when the SET N-channel transistor 104 is damaged during fuse blowing, a value (potential, node) in the SNODE 105 when the fuse is programmed becomes the same as a value (potential, node) being output from the F node.

Generally, such problems as described above can occur easier in proportion to the miniaturization of the SET N-channel transistor 104, which is provided near the fuse metal 103. In addition, suppose that, for example, the output (energy) of the laser beam 102 is reduced or the beam diameter of the laser beam 102 is reduced to eliminate the probability of damage on the SET N-channel transistor 104. In this case, cutting of the fuse metal 103, per se, becomes difficult. In other words, even appropriate fuse blowing becomes difficult. Consequently, for the semiconductor integrated circuit 101, which has the circuit configuration shown in FIG. 7, to satisfy the conditions of achieving appropriate fuse blowing without damaging the SET N-channel transistor 104, further miniaturization is difficult to be implemented for, for example, various interior devices and interior circuits, such as the fuse metal 103 and the SET N-channel transistor 104. This leads to difficulties in overall compaction (down-sizing) of the semiconductor integrated circuit 101.

The first embodiment of the present invention is presented to solve the problems. A semiconductor integrated circuit according to the present embodiment that, even when a component such as a circuit or element near a fuse is damaged during fuse blowing event, is capable of exhibit an appropriate function equivalent to that obtainable in appropriate fuse blowing, regardless of the size of the component such as the element or circuit near the fuse. More specifically, the semiconductor integrated circuit according to the present embodiment is designed to be a nonvolatile memory device that, even when a transistor near the fuse is broken during fuse blowing, is capable of outputting a preset value equivalent to that obtainable in an event where fuse blowing is appropriately performed and the transistor is normally functioning.

Figure 1:
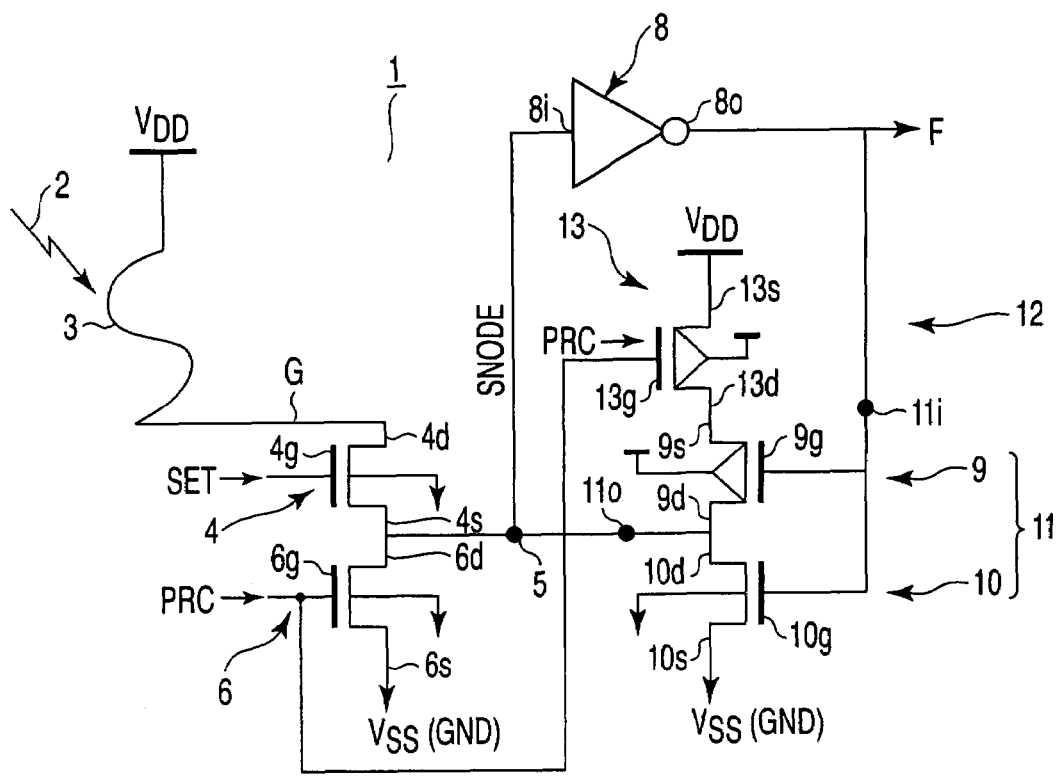
FIG. 1 is a schematic view of a semiconductor integrated circuit according to a first embodiment of the present invention.
Figure 2:
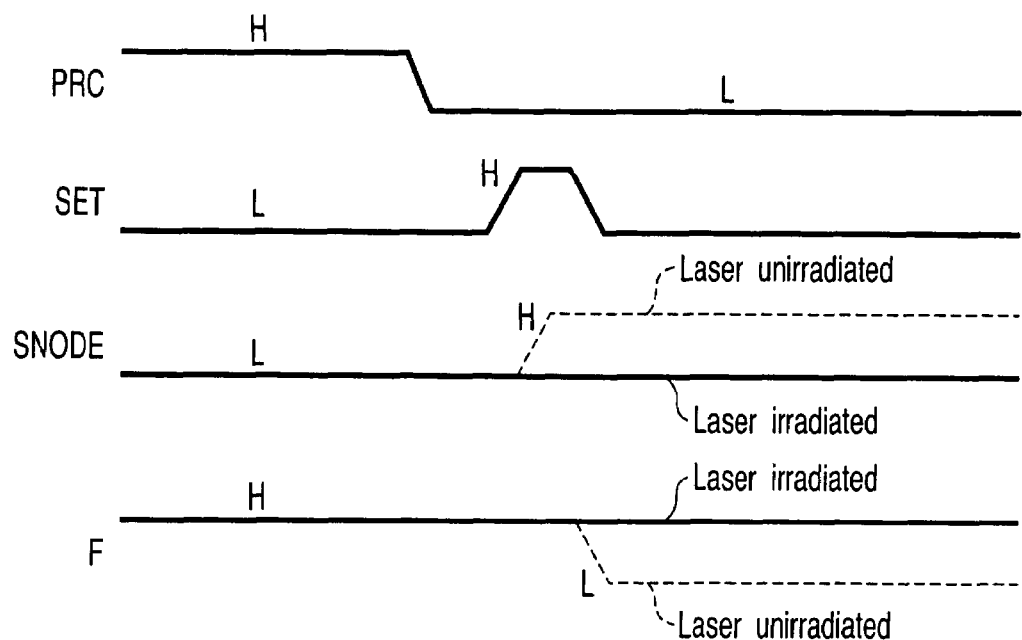
FIG. 2 is a view showing operation waveforms in the semiconductor integrated circuit shown in FIG. 1.

The semiconductor integrated circuit of the present embodiment will now be described with reference to FIGS. 1 to 4. FIG. 1 is a schematic view of the semiconductor integrated circuit according to the present embodiment. FIG. 2 is a view showing operation waveforms in the semiconductor integrated circuit shown in FIG. 1. FIG. 3 is a cross-sectional view of a peripheral portion of a fuse of the semiconductor integrated circuit shown in FIG. 1. FIG. 4 is an enlarged view of a portion surrounded by a circle A in FIG. 3.

In the present embodiment, one end portion of a laser beam irradiation metal (fuse) is electrically connected to the power source potential ($V_{DD}$), and the other end portion of the metal is electrically connected to the drain of an N-channel transistor. The $V_{DD}$ potential is fed via the N-channel transistor to a storage circuit in which the laser beam irradiation metal is not programmed (fuse-blown), thereby the ROM (read only memory) function is implemented. According to this configuration, even when the N-channel transistor is broken by programming, the ROM function equivalent to that obtainable in the event where the laser beam irradiation metal is vaporized by programming thereby to cut off the conduction. Thereby, even with a semiconductor integrated circuit (ROM) containing semiconductor devices shrunken (miniaturized or compacted) more than before, the function equivalent to that of a conventional ROM can be implemented by using a currently-used ordinary laser repair apparatus. A more detailed description will be provided hereinbelow.

Firstly, with reference to FIG. 1, a circuit configuration of the semiconductor integrated circuit, 1, according to the present embodiment will be describe here. Similar to the above-described semiconductor integrated circuit 101 according to the prior art, the semiconductor integrated circuit 1 also has a circuit configuration that implements the ROM function by using the laser-fuse programming.

With reference to FIG. 1, a fuse metal 3 is provided as being a laser beam irradiation object that is irradiated with a laser beam 2. The fuse metal 3 has one end portion to which $V_{DD}$ representing a first potential is fed and which serves as being a $V_{DD}$ node. Thus, in the present embodiment, the first potential $V_{DD}$ is set as a power source potential, and the one end portion of the fuse metal 3 is used as a $V_{DD}$ power node. With this arrangement, the other end portion of the fuse metal 3 is electrically connected to a drain 4d of a first transistor 4 that has a channel formed in a first conductivity type. In the present embodiment, the first conductivity type is referred to as N type. Accordingly, the first transistor 4 in the present embodiment is referred to as an N-channel transistor. In addition, the drain 4d of the first transistor 4 is electrically connected with the programming-dedicated fuse metal 3, the first transistor 4 is also referred to as a programming N-channel transistor. In a description given herebelow, the first transistor is referred to as "programming N-channel transistor 4". The conduction in the fuse metal 3 is cut off in the manner that the fuse metal 3 is irradiated with the laser beam 2, whereby the fuse metal 3 is vaporized. The fuse-blowing functions to program the semiconductor integrated circuit 1 into an appropriate circuit configuration that exhibits the predetermined function dictated for the ROM, which is one of nonvolatile memory devices.

Although not shown in the drawing, from the viewpoints of miniaturization, high integration, and the like of interior circuits, such the metal layer used as an uppermost layer is, ordinarily, is formed thicker (bigger) than other layers in a semiconductor integrated circuit formed of an ordinary multilayered wiring structure. Therefore, in the semiconductor integrated circuit 1 having, for example, a multilayered wiring structure, a metal layer (wiring layer) of an uppermost layer which is easy to be focused the laser beam 2, is preferably used as a fuse metal 3 (fuse wire). In addition, from viewpoints of miniaturization, high integration, and the like of interior circuits, in the semiconductor integrated circuit 1 having the multilayered wiring structure, the fuse metal 3 and the programming N-channel transistor 4 are preferably electrically interconnected through a shortest-possible electrical conduction path. Accordingly, although not shown in the drawings, in the semiconductor integrated circuit 1 having a multilayered wiring structure, it is preferable that an uppermost layer formed of a metal layer positioned substantially just above the programming N-channel transistor 4 be used as the fuse metal 3, and the fuse metal 3 and the first transistor 4 be electrically interconnected with a shortest-possible (electrical) conduction path.

Here, as shown in FIG. 1, a conduction path (node) between the fuse metal 3 and the programming N-channel transistor 4 is represented by the letter "G". As the node G is shorter, the conductivity thereof for energy, which is provided from the laser beam 2, to the programming N-channel transistor 4 becomes higher. In other words, as the length of the node G is shorter, the programming N-channel transistor 4 becomes more easily damaged or broken by the laser beam 2. Further, as the thickness of the fuse metal 3 is thicker, the fuse metal 3 becomes more difficult to be fuse blown. In other words, as the thickness of the fuse metal 3 is thicker, the energy of the laser beam 2 must becomes higher (bigger). Accordingly to this, the programming N-channel transistor 4 proportionally becomes more easily damageable or breakable by the laser beam 2. Therefore, when the programming N-channel transistor 4 and the uppermost layer formed of the fuse metal 3 positioned substantially just above the programming N-channel transistor 4 are electrically interconnected through the shortest-possible node G, the programming N-channel transistor 4 becomes significantly easily breakable during fuse blowing.

In comparison, however, as described below in more detail, different from the above-described semiconductor integrated circuit 101 according to the prior art, in the semiconductor integrated circuit 1 of the present embodiment, when the fuse metal 3 is fuse-blown, damage to the programming N-channel transistor 4 is tolerable. More specifically, the semiconductor integrated circuit 1 tolerates such an event wherein the programming N-channel transistor 4 is damaged by the laser beam 2 during fuse blowing, thereby to cause failure in its function or not to be appropriately operable. The semiconductor integrated circuit 1 further tolerates an event wherein part of the programming N-channel transistor 4 is broken by the laser beam 2 during fuse blowing. From these viewpoints, the programming N-channel transistor 4 is also called a breaking-down N-channel transistor.

As described above, as the thickness of the fuse metal 3 is increased and/or as the length of the node G is reduced, the breakage probability of the programming N-channel transistor (setting N-channel transistor) 4 during fuse blowing is increased. However, in the semiconductor integrated circuit 1 of the present embodiment, even when part of the programming N-channel transistor 4 is broken, data transformation does not occur, so that the node G can be shortened as much as possible. Consequently, in the event that the semiconductor integrated circuit 1 of the present embodiment is formed to have a multilayered wiring structure, a metal layer laid as an uppermost layer positioned substantially just above the programming N-channel transistor 4 can be used for the fuse metal 3. In addition, the fuse metal 3 and the programming N-channel transistor 4 can be electrically interconnected through the shortest-possible node G.

As shown in FIG. 1, a SNODE 5 is formed of a node indicative of the state of the fuse metal 3 in the event that fuse blowing is appropriately performed and the fuse metal 3 has been appropriately broken. That is, the SNODE 5 is formed of the node indicative of the circuit state of the semiconductor integrated circuit 1 in the event that programming has been appropriately performed. The SNODE 5 is electrically connected to a source 4s of the programming N-channel transistor 4. A set signal SET serving as a first signal is input at a gate 4g of the programming N-channel transistor 4. Thereby, when SET is activated to "H", the SNODE 5 is pulled up (set) to "H". The programming N-channel transistor 4 is called SET or breaking-down N-channel transistor (as described above).

As shown in FIG. 1, the SNODE 5 is additionally electrically connected to a drain 6d of a second transistor 6 that has a channel of the same N type (first conductivity type) as the channel of the programming N-channel transistor 4, which is defined as the first transistor. Accordingly, the SNODE 5 is a connecting portion of the programming N-channel transistor 4, the precharging N-channel transistor 6, and a below-described latch circuit 12 serving as a storage circuit. The second transistor 6 is provided to precharge to precharge the SNODE 5, so that it is also called as the precharging N-channel transistor 6. Description herebelow will refer the second transistor 6 as the precharging N-channel transistor 6. In addition, the source 4s of the programming N-channel transistor 4 is electrically connected to a drain 6d of the precharging N-channel transistor 6. $V_{SS}$ defined as a second potential different from $V_{DD}$ (power source potential) defined as a first potential is applied at a source 6s of the precharging N-channel transistor 6. In the present embodiment, $V_{SS}$ defined as the second potential is set lower than $V_{DD}$ defined as the first potential. More specifically, $V_{SS}$ is set as a ground potential (GND), and the source 6s of the precharging N-channel transistor 6 is grounded. A precharge signal PRC defined as a second signal, which is different from the first signal SET, is input at a gate 6g of the precharging N-channel transistor 6. With the precharging P-channel transistor 6, when PRC is activated to "H", the SNODE 5 is set to "L", that is, is set to the precharge state.

The SNODE 5 is additionally electrically connected to an input 8i of a first inverter 8. An output 8o of the first inverter 8 is input at a gate 9g of a latch-feedback P-channel transistor 9 and at a gate 10g of a latch-feedback N-channel transistor 10 which is defined as a forth transistor. There are electrically interconnected between a drain 9d of the latch-feedback P-channel transistor 9 and a drain 10d of the latch-feedback N-channel transistor 10. The latch-feedback P-channel transistor 9 and the latch-feedback N-channel transistor 10 together constitute a CMOS inverter 11, which is configured of PMOS and NMOS transistors being electrically interconnected. The CMOS inverter 11 is defined as a second inverter. The CMOS inverter 11 hereafter will be alternatively referred to as a "feed-back inverter" to prevent confusion with the first inverter 8. As described above, the output 8o of the first inverter 8 is electrically connected to an input 11i of the second inverter 11.

Similar to the respective source 4s and respective drain 6d of the programming N-channel transistor 4 and the precharging P-channel transistor 6, the respective drains 9d and 10d of the latch-feedback P-channel transistor 9 and the latch-feedback N-channel transistor 10 are electrically connected to the SNODE 5. An output 11o of the second inverter 11 accordingly is electrically connected to the SNODE 5. Concurrently, the output 11o of the second inverter 11 is electrically connected to the input 8*i* of the first inverter 8 through the SNODE 5. Thus, the second inverter 11 is formed of the first inverter 8, the latch-feedback P-channel transistor 9, and the latch-feedback N-channel transistor 10, whereby the latch circuit 12 is formed as a storage circuit through the SNODE 5. The latch circuit 12 is electrically connected through the SNODE 5 to the source 4*s*, which is one of the ends (source 4*s* and drain 4*d* of the programming N-channel transistor 4) to which the other end portion of the fuse metal 3 is not connected.

According to the circuit configuration, even when both SET and PRC are in inactive states, the latch-feedback P-channel transistor 9 and the latch-feedback N-channel transistor 10 can play the role of fixing (holding) the SNODE 5 to the precharge state or the set state. Namely, even when both SET and PRC are "L", the latch-feedback P-channel transistor and the latch-feedback N-channel transistor 10 can fix the SNODE 5 to "H" or "L".

A source 10*s* of the latch-feedback N-channel transistor 10 is electrically connected to $V_{SS}$ (grounded). A source 9*s* of the latch-feedback P-channel transistor 9 is electrically connected to a drain 13*d* of another P-channel transistor 13. The precharge signal PRC is input at a gate 13*g* of the P-channel transistor 13. A source 13*s* of the P-channel transistor 13 is connected to $V_{DD}$ (power source potential). The P-channel transistor 13 is provided to function such that while PRC is activated and the SNODE 5 is being precharged, the latch-feedback P-channel transistor 9 is invalidated thereby to restrain a leakage current from flowing to the SNODE 5. In other words, while PRC is "H" and the SNODE 5 is "L", the P-channel transistor 13 invalidates the latch-feedback P-channel transistor 9, thereby reducing the leakage current that flows to the SNODE 5.

A potential on the side of the output 8*o* of the first inverter 8 serves as an F node indicative of an output value of the semiconductor integrated circuit 1 (ROM) wherein the fuse metal 3 is programmed by being fuse-blown. The F node is "H" when the fuse metal 3 is cut, and it becomes "L" when the fuse metal 3 is intact or uncut. In the semiconductor integrated circuit 1 having the circuit configuration described above, even when the programming N-channel transistor 4 is broken when the fuse metal 3 is fuse-blown, the F node becomes "H" similarly as in the case where the fuse metal 3 is appropriately cut off. Although not shown, in the semiconductor integrated circuit 1, $V_{SS}$ is fed to individual back biases of the N-channel transistors 4, 6, and 10, and $V_{DD}$ is fed to individual back biases of the P-channel transistors 9 and 13.

With reference to FIGS. 3 and 4, structures near the fuse metal 3 and the programming N-channel transistor 4 of the semiconductor integrated circuit 1 will be described herebelow. FIG. 4 is an enlarged view of a portion surrounded by a circle A in FIG. 3.

As shown FIGS. 3 and 4, the programming N-channel transistor 4 is provided on a surface layer portion of a semiconductor substrate 14 located lower than the fuse metal 3. More specifically, the programming N-channel transistor 4 is provided such that the source 4*s* and drain 4*d* thereof are formed in a well 15. The present embodiment uses a P-type semiconductor substrate for the semiconductor substrate 14. Accordingly, the conductivity type of the well 15 is P. The source 4*s* and the drain 4*d* are individually formed as diffusion layers of an $N^+$ conductivity type. A gate oxide film 16 is provided between the source 4*s*, drain 4*d*, and P-well 15 and the gate 4*g* (gate conductor). In addition, gate sidewall films 17 are provided in side sections of the gate 4*g*. And more, in the present embodiment, the P-type semiconductor substrate 14 is used, so it is not necessarily to form the P-well 15.

In addition, as shown in FIG. 3, the drain 4*d* of the programming N-channel transistor 4 is electrically connected to the fuse metal 3 through multiple plugs 18 such as contact plugs and via plugs provided in multiple layers, and multiple wiring layers (metal layers) 19 similarly provided in multiple layers. More particularly, the fuse metal 3 is connected to a lower layer metal 19*a* via the plugs 18 and the like. The lower layer metal 19*a* is connected to a first metal wiring layer 19*b* through a first via contact 18. The first metal wiring layer 19*b* is connected through a lowermost layer contact 18*b* to an $N^+$ diffusion layer 4*d* being used as the drain of the programming N-channel transistor 4. Thus, the node G, which connects between the fuse metal 3 and the drain 4*d* of the programming N-channel transistor 4, is configured of, the multiple plugs 18, the multiple wiring layers 19, and the like. As described above, in the semiconductor integrated circuit 1 having the multilayered wiring structure, as shown in FIG. 3, the fuse metal 3 is preferably provided substantially just above the programming N-channel transistor 4.

Similar to the above, although all are not shown, the multiple plugs 18 inclusive of the lowermost layer contact 18*b* and the first metal wiring layer 19*b*, the multiple wiring layers 19, and the like are electrically connected to the source 4*s* of the programming N-channel transistor 4. The source 4*s* is electrically connected to, for example, the drain 6*d* of the precharging N-channel transistor 6 and the SNODE 5 through the plugs 18, the wiring layers 19 and the like. Further, A set signal SET is input at a gate 4*g* of the programming N-channel transistor 4, as described above. Similarly, although not shown, also the P-type semiconductor substrate 14 is electrically connected to $V_{SS}$ through, for example, the P-well 15, the multiple plugs, the multiple wiring layers, and the like.

As described above, the semiconductor integrated circuit 1 of the present embodiment tolerates the event in which the programming N-channel transistor 4 connected to the fuse metal 3 is partly damaged by the fuse-blowing laser beam 2 to be unable to normally operate. More specifically, the programming N-channel transistor 4 tolerates the event in which one of the source 4*s* and drain 4*d* thereof to which the fuse metal 3 is not connected is damaged by the laser beam 2. As shown in FIG. 3, in the semiconductor integrated circuit 1, the fuse metal 3 is electrically connected to the drain 4*d* of the programming N-channel transistor 4. Therefore, the semiconductor integrated circuit 1 tolerates an event in which the source 4*s* of the programming N-channel transistor 4 is broken by the laser beam 2, thereby causing damage of a portion between the source 4*s* thereof and at least one of the gate 4*g* and the P-type semiconductor substrate 14. The detailed description thereof will be given with reference to FIG. 4.

In the case of breakage of the source ($N^+$ diffusion layer) 4*s* of the programming N-channel transistor 4, the manner or case of breakage can be broadly divided into two. One of them is a case where, as shown by a void arrow B in FIG. 4, breakage occurs in a portion between the gate (gate conductor) 4*g* and the source 4*s* of the programming N-channel transistor 4. The other is a case where, as shown by a void arrow C in FIG. 4, breakage occurs in a portion between the source 4*s* of the programming N-channel transistor 4 and the P-well 15 (the P-type semiconductor substrate 14).

In the first case where the breakage occurs in the portion between the gate 4g and the source 4s of the programming N-channel transistor 4, the laser beam 2 energy to be stored in the fuse metal 3 during fuse blowing is transferred to the gate conductor 4g. The energy breaks the gate oxide film 16 provided between the gate conductor 4g and the source 4s, thereby causing so called "gate-diffusion layer breakage". As a result, the gate 4g and the source 4s (SNODE 5) are short-circuited thereby to be communicative each other. In the latter case where the breakage occurs in the portion between the source 4s of the programming N-channel transistor 4 and the P-well 15, the laser beam 2 energy to be transferred through the fuse metal 3 causes the breakage in a junction between the source 4s and the P-well 15. That is, there occurs so called "diffusion layer-well breakage". As a result, the source 4s (SNODE 5) and the P-well 15 (back bias) are short-circuited thereby to be communicative each other. Consequently, the SNODE 5 is fixed to $V_{SS}$ having the same potential as the gate 4g.

In any of the case of the gate-source (diffusion layer) breakage and the case of the source (diffusion layer)-well breakage, the node of the source 4s formed of the $N^+$ diffusion layer is set to $V_{SS}$. More specifically, the source 4s is fixed to "L" equivalently to the case of appropriate fuse blowing (programming). The node in this case is the SNODE 5 shown in FIG. 1. When the node of the source 4s is used for the SNODE 5, the source 4s is electrically connected to, for example, a different transistor (not shown) through the lowermost layer contact 18b, the first metal wiring layer 19b, and the like. With the SNODE 5 thus being fixed, the semiconductor integrated circuit 1 implements the predetermined ROM function. Even when the gate-source (diffusion layer) breakage and the source (diffusion layer)-well breakage have occurred at the same time, the semiconductor integrated circuit 1 is, of course, able to implement the predetermined ROM function.

Next, operation of the semiconductor integrated circuit (ROM) 1 will now be described hereunder with reference to FIG. 2. FIG. 2 shows operation waveforms in the individual PRC, SET, SNODE 5, and F node of the semiconductor integrated circuit 1. As shown in FIG. 2, in an initial state, PRC is in the active state "H", and SET is in the inactive state "L". Concurrently, in the initial state, since the precharging N-channel transistor 6 is activated to "H", the SNODE 5 is in the precharge state "L". In contrast, the F node is "H". Subsequently, PRC is turned from the active state "H" to the inactive state "L". In this state, both the SNODE 5 and F node are not changed in state; that is, the SNODE 5 remains at "L", and the F node remains at "H". Thereafter, SET is temporarily activated to turn from the inactive state "L" to the active state "H".

When SET is temporarily turned to "H", the programming N-channel transistor 4 is activated. However, if the fuse metal 3 was irradiated the laser beam 2, since a path (conduction path) connecting from the SNODE 5 to $V_{SS}$ is not present, the SNODE 5 is electrically connected with high resistance to $V_{DD}$ through, for example, an insulating film (not shown). Concurrently, in this state, the latch-feedback N-channel transistor 10 also is in the active state. As a result, as shown by a solid line in FIG. 2, even when SET either is staying at "H" or has returned from "H" to "L", the SNODE 5 is kept to remain at "L". Accordingly, also the F node is kept to all-time remain at "H", regardless of the operation states of, for example, PRC and SET.

In addition, suppose that in the event that SET is temporarily turned to "H", at least one of the gate-diffusion layer breakage and the diffusion layer-well breakage has been preliminarily caused by fuse blowing on the source 4s of the programming N-channel transistor 4. More specifically, suppose that when SET is temporarily turned to "H" and thereafter turned to "L", the source 4s of the programming N-channel transistor 4 is already broken causing short-circuiting in the vicinity of the source 4s to the extent of disabling appropriate operation. In this case, the semiconductor integrated circuit 101 outputs a value different from the value preset for the predetermined input value, and is unable to appropriately exhibit the predetermined ROM function.

However, in the semiconductor integrated circuit 1 of the present embodiment that has the above-described circuit configuration, SNODE 5 is originally fixed "L" when the source 4s of the programming N-channel transistor 4 is broken to the extent of being incapable of perform appropriate operation. So, the latch-feedback N-channel transistor 10 is "On". In this case, the path for the "L" does not scramble for the current. As a result of this, SNODE 5 is held to "L", and a potential of F is held to "H" continuously. In the other words, in the case of the source-well breakage, the SNODE 5 is fixed to $V_{SS}$ of the same in potential as the gate 4g of the programming N-channel transistor 4, as described above. And in the case of the gate-source breakage, SET becomes "H" once, the SNODE 5 correspondingly becomes "H". However, the gate 4g changes to "L" from "H", the SNODE 5 correspondingly turns to "L" from "H". Since the SNODE 5 is fixed to "L", a bit to be programmed can fix the SNODE 5 to "L". Accordingly, as shown by the solid line in FIG. 2, irrespective of the operation state of PRC or SET, also the F node is all time remained at "H" from the initial state, similarly as in the case where appropriate programming is performed.

In the event that SET is temporarily turned to "H", when the fuse metal 3 is unirradiated with the laser beam 2 and hence the fuse metal 3 is unblown, the SNODE 5 is electrically connected to $V_{DD}$ through the programming N-channel transistor 4 and the fuse metal 3. In addition, when the fuse metal 3 is unblown, the latch-feedback N-channel transistor 10 is in the activated state. In this case, the resistance of a path extending from the SNODE 5 to $V_{DD}$ through the programming N-channel transistor 4 and the fuse metal 3 is preset lower than the resistance of a path extending from the SNODE 5 to the drain 10d of the latch-feedback N-channel transistor 10. As such, the conductive state of the path to $V_{DD}$ from the SNODE 5 wins (takes precedence over) the conductive state of the path extending to the latch-feedback N-channel transistor 10 from the SNODE 5.

Consequently, as shown in the broken line in FIG. 2, when SET changes to "H" from "L", the SNODE 5 accordingly is pulled up (changed) to "H" from "L". Even after SET has returned to "L" from "H", the SNODE 5 is remained at "H". Accordingly, as shown by the broken line in FIG. 2, after the SNODE 5 has been pulled up to "H", the F node correspondingly is drawn to "L" from "H" (pulled down or changed). Then, similar to the SNODE 5, even after SET has returned to "L" from "H", the F node is remained at "L".

Thus, in the semiconductor integrated circuit 1 of the present embodiment, the SNODE 5 remains at "L" and F remains at "H" in the state where appropriate fuse blowing has been carried out, or at least one of the gate-diffusion layer breakage and the diffusion layer-well breakage has occurred at the source 4s of the programming N-channel transistor 4. On the other hand, in the state where the fuse metal 3 is unblown, the SNODE 5 becomes "H" and F becomes "L". As a result, the semiconductor integrated circuit 1 is able to implement the predetermined ROM function.

As described above, the first embodiment has the circuit configuration that, even when a circuit or device near the fuse is damaged during fuse blowing, is able to exhibit the appropriate function equivalent to that obtainable in the event where appropriate fuse blowing has occurred. More specifically, in the semiconductor integrated circuit 1 of the present embodiment, even when the programming N-channel transistor 4 connected to the fuse metal 3 is broken during fuse blowing, a result equivalent to that obtainable when appropriate fuse blowing occurs thereby to cut off the fuse metal 3. Conventionally, when appropriate fuse blowing does not occur and, concurrently even when one device or circuit near the fuse metal 3 is broken, the semiconductor integrated circuit is disabled overall to exhibit the storage function, and hence is determined to be a defective product. However, in the semiconductor integrated circuit 1 of the present embodiment, even when the programming N-channel transistor 4 provided near the fuse metal 3 is broken, the semiconductor integrated circuit 1 is able to exhibit the appropriate storage function as described above. That is, in the semiconductor integrated circuit 1, reduction in a so-called fuse blowing margin is restrained, whereby the yield is improved. In addition, the semiconductor integrated circuit 1 of the present embodiment is improved for stability, reliability, quality, and the like.

In addition, the semiconductor integrated circuit 1 of the present embodiment tolerates breakage of the programming N-channel transistor 4 during fuse blowing, as described above. Therefore, the area of the fuse metal 3 need not be set to an area with which the programming N-channel transistor 4 and the like can be protected from the laser beam 2. That is, the area of the fuse metal 3 is sufficient if it allows absorption of the energy of the laser beam 2 to achieve appropriate cutting-off of the fuse metal 3 itself. Thereby, the fuse metal 3 according to the present embodiment enables the function required for the fuse metal to be implemented with a smaller area, compared with the conventional fuse metal that is impaired in conductivity through vaporization caused by laser beam irradiation and that is provided for the primary purpose of protecting the programming N-channel transistor from the laser beam.

Consequently, in the semiconductor integrated circuit 1, the area of the fuse metal 3 as well as the area of a fuse wiring region (not shown) where a plurality of fuse metals 3 are provided can be significantly reduced. In addition, as described above, since semiconductor integrated circuit 1 of the present embodiment tolerates the breakage of the programming N-channel transistor 4 and the like during fuse blowing, the programming N-channel transistor 4 and the fuse metal 3 positioned substantially just above it can be electrically interconnected by the shortest possible node G. That is, the programming N-channel transistor 4 can be provided in proximity to a portion just below the fuse metal 3. Further, in the semiconductor integrated circuit 1 of the present embodiment, by using the transistor 4 reduced to a size to be breakable during fuse blowing, the ROM function in the semiconductor integrated circuit 1 can be implemented with a smaller area than in the conventional case. Further, even when the semiconductor integrated circuit 1 has the multilayered wiring structure, fuse blowability and miniaturization and high integration of interior devices and interior circuits of the semiconductor integrated circuit 1 can be compromised with high level.

Accordingly, the circuit configuration of the semiconductor integrated circuit 1 according to the present embodiment can significantly contribute to further miniaturization, high integration, and the like of the interior devices and the interior circuits of the semiconductor integrated circuit 1 without impairing the inherent ROM function. Consequently, the present embodiment can significantly contribute to appropriate and stabilized operation of the entirety of the semiconductor integrated circuit 1 and to further compaction (downsizing) of the entirety of the semiconductor integrated circuit 1.

Further, according to semiconductor integrated circuit 1 having the above-described circuit configuration, even in the case where the interior devices and interior circuits are reduced in size, it is not necessarily to reduce the energy of the fuse-blowing laser beam 2. Accordingly, appropriate fuse blowing can be done without breaking a device or circuit near the fuse metal 3. Generally, when, for example, the energy of the laser beam 2 is reduced corresponding to miniaturization of interior devices and interior circuits of the semiconductor integrated circuit, fuse blowing of the fuse metal becomes difficult. Accordingly to this, appropriate fuse blowing becomes to be difficult, and prolongs the processing time because of the fuse-blowing operation.

However, as described above, the semiconductor integrated circuit 1 of the present embodiment tolerates the breakage of the programming N-channel transistor 4, which is provided near the fuse metal 3, to occur during fuse blowing. Accordingly, in the semiconductor integrated circuit 1, even in the case where the interior devices or the interior circuits are further shrunk, fuse blowing (programming) can be performed by using a generally used fuse-blowing laser beam radiation device (laser fuse repair device). More specifically, according to the present embodiment, even in the event that transistors further shrunk further than in the convention case, a semiconductor integrated circuit 1 can be provided that has small-area nonvolatile memory devices (not shown) capable of implementing desired ROM function by the fuse blowing (programming) using an ordinary laser fuse repair device. Consequently, according to the present embodiment, a high quality semiconductor integrated circuit 1 capable of appropriately exhibiting desired ROM function can be produced with high efficiency by using an ordinary fuse-blowing laser repair device.

Second Embodiment

Figure 5:
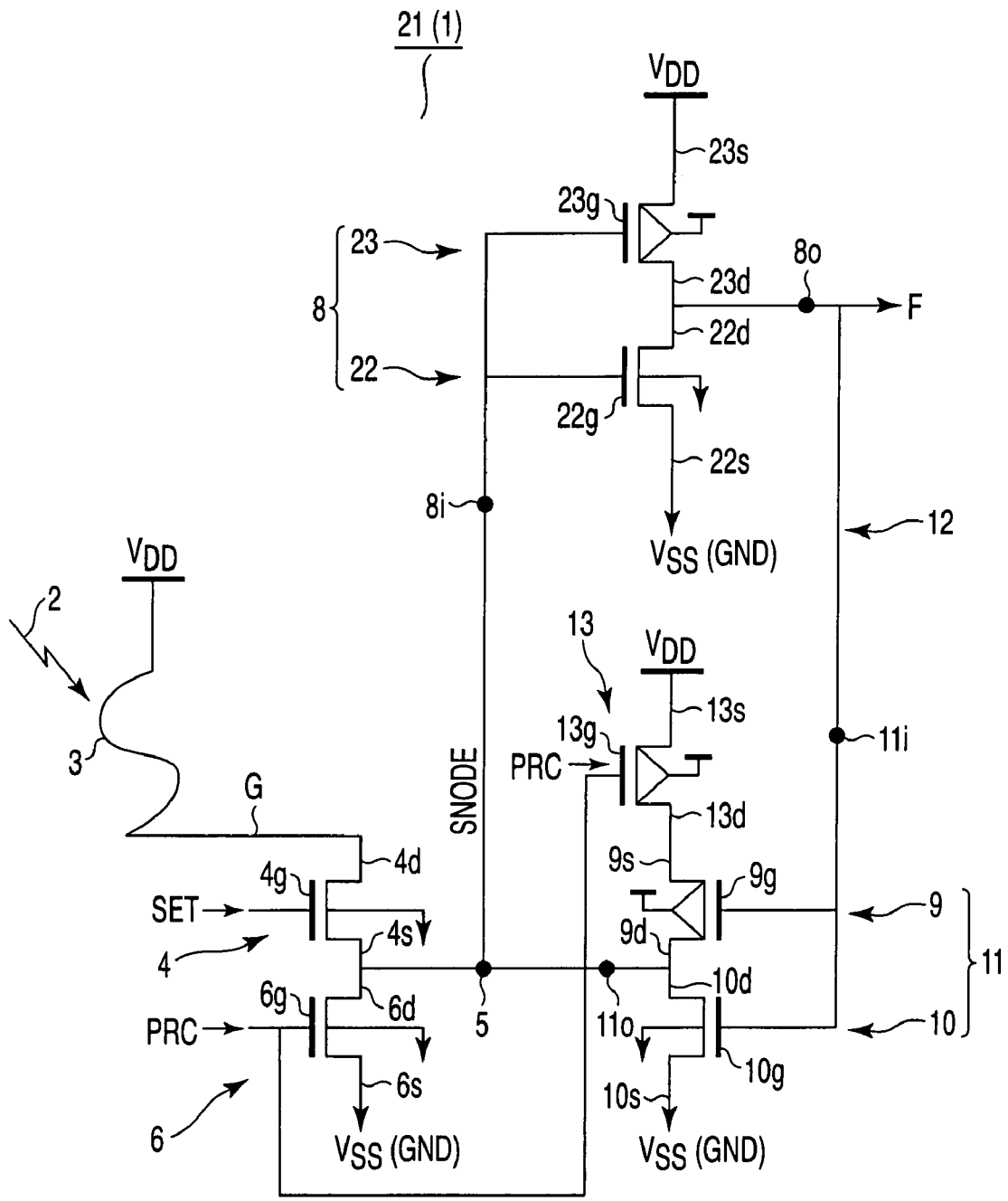
FIG. 5 is a schematic view of an equivalent circuit of the semiconductor integrated circuit shown in FIG. 1, which is shown therein by way of a semiconductor integrated circuit according to a second embodiment of the present invention.

A second embodiment of the present invention will now be described here with reference to FIG. 5. FIG. 5 is a schematic view of an equivalent circuit of the semiconductor integrated circuit shown in FIG. 1, by way of the semiconductor integrated circuit of the present embodiment. The same reference characters designate the same portions of the above-described first embodiment.

In the present embodiment, a description will be made regarding techniques for driving circuits to stably function in the semiconductor integrated circuit 1 according to the first embodiment described above. In the semiconductor integrated circuit 1 of the first embodiment shown in FIG. 1, the potential of the gate 4g of the programming N-channel transistor 4 is $V_{DD}$ at maximum. Accordingly, an undesirable case can occur in which a driving force becomes insufficient the SNODE 5. To prevent such the undesirable case, threshold-voltage reducing channel implants are preferably inserted into channels of the programming N-channel transistor 4 and of a third transistor that constitutes the first inverter 8 and that has N channel of the same conductivity type as that of programming N-channel transistor 4. Description will be made below with reference to FIG. 5.

As shown in FIG. 5, a semiconductor integrated circuit 21 of the present embodiment is substantially equivalent to the semiconductor integrated circuit 1 of the first embodiment. More specifically, the semiconductor integrated circuit 21, which is shown in FIG. 5, is such that the first inverter 8 of the semiconductor integrated circuit 1 shown in FIG. 1 is represented as a CMOS inverter formed by connecting an NMOS transistor (N-channel transistor) 22 which is defined as a third transistor and a PMOS transistor (P-channel transistor) 23.

As shown in FIG. 5, respective gates 22g and 23g of the N-channel transistor 22 and the P-channel transistor 23 are electrically connected to the SNODE 5. The individual gates 22g and 23g are used as the input 8i of the first inverter 8. A drain 22d of the N-channel transistor 22 and a drain 23d of the P-channel transistor 23 are electrically interconnected. The individual drains 22d and 23d are used as the output 8o of the first inverter 8. A source 22s of the N-channel transistor 22 is electrically connected to $V_{SS}$ (GND) (grounded). In addition, a source 23s of the P-channel transistor 23 is electrically connected to $V_{DD}$ (power source potential).

In the semiconductor integrated circuit 1 having the circuit configuration described above, threshold-voltage reducing channel implants are injected into the individual channels of the programming N-channel transistor 4 and the N-channel transistor 22. Thereby, impurity concentrations of the individual channels of the programming N-channel transistor 4 and the N-channel transistor 22 are reduced. More specifically, threshold values of the programming N-channel transistor 4 and the N-channel transistor 22 are set lower than threshold values of the precharging N-channel transistor 6 and the latch-feedback P-channel transistor 10. As a result, the margin of the driving force for the SNODE 5 can be further increased.

As described above, according to the second embodiment, effects equivalent those of the first embodiment can be obtained. Further, since the margin of the driving force for the SNODE 5 is increased higher than that of the first embodiment, the semiconductor integrated circuit 21(1) can even more stably exhibit the desired ROM function. Consequently, the semiconductor integrated circuit 21(1) is improved in, for example, performance and reliability.

Third Embodiment

A third embodiment of the present invention will be described here with reference to FIGS. 1, 3, and 5. The same reference characters designate the same portions of the above-described first and second embodiments, and detailed descriptions thereof will be omitted herefrom.

Similarly as in the second embodiment, a description will concisely be made regarding other techniques for driving circuits of the semiconductor integrated circuit 1 to stably function.

In the respective semiconductor integrated circuits 1 and 21 shown in FIGS. 1 and 5, the driving force of the programming N-channel transistor 4 is lower than the driving force of the latch-feedback P-channel transistor 10, so that it is difficult for the programming N-channel transistor 4 to win (to take precedence over) the latch-feedback P-channel transistor 10. In this case, the gate oxide film 16 having a larger film thickness is preferably used for the programming N-channel transistor 4. More specifically, the film thickness of the gate oxide film 16 of the programming N-channel transistor 4 shown in FIG. 3 is preferably larger than the film thicknesses of gate oxide films (not shown) of other N-channel transistors such as the precharging N-channel transistor 6 and the latch-feedback P-channel transistor 10. Thereby, the potential of the SET signal to be input to the programming N-channel transistor 4 can be driven to transit at a potential higher than an ordinary range of 0 to $V_{DD}$. More specifically, a SET signal (SETH) of a higher potential may be applied (input) to the programming N-channel transistor 4. Consequently, the driving force of the programming N-channel transistor 4 becomes higher than the driving force of the latch-feedback P-channel transistor 10, thereby to be able to win the latch-feedback P-channel transistor 10.

As described above, according to the third embodiment, effects equivalent to those of the first and second embodiments can be obtained.

Fourth Embodiment

Figure 6:
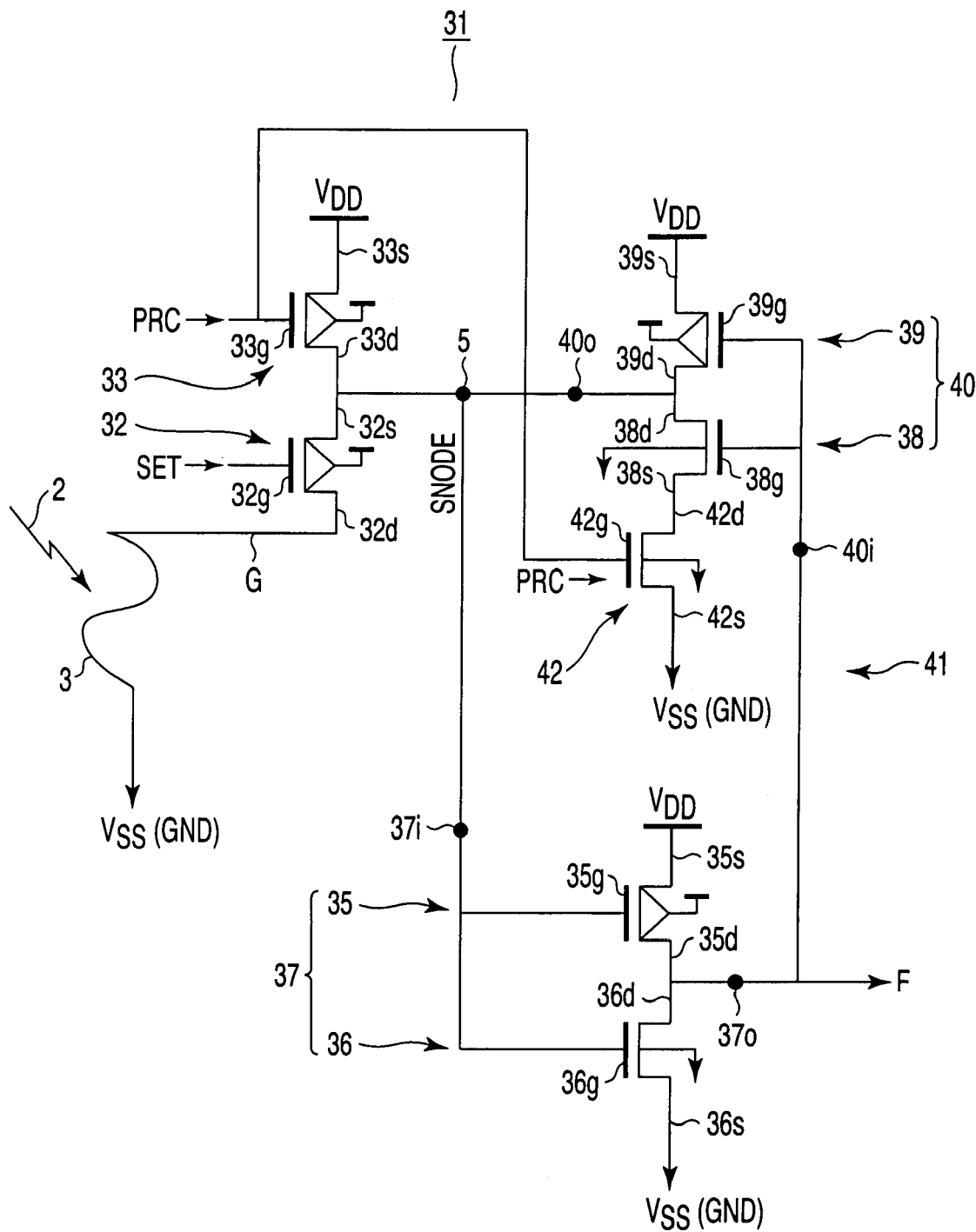
FIG. 6 is a schematic view of a modified example of the semiconductor integrated circuits shown in FIGS. 1 and 5, the modified example being shown therein by way of a semiconductor integrated circuit according to a fourth embodiment of the present invention.

A fourth embodiment of the present invention will be described here with reference to FIG. 6. FIG. 6 shows a schematic view of a modified example of the semiconductor integrated circuits shown in FIGS. 1 and 5, the modified example being shown therein by way of the present embodiment. The same reference characters designate the same portions in the individual first to third embodiments, and detailed descriptions thereof will be omitted herefrom.

The present embodiment is configured by reversing the individual conductivity types of the programming N-channel transistor 4 and the precharging N-channel transistor 6 of each of the above-described semiconductor integrated circuits 1 and 21, and the potential connected to the programming N-channel transistor 4. Description will be concisely made herebelow with reference to FIG. 6.

As shown in FIG. 6, in the semiconductor integrated circuit 31 of the present embodiment, the one end portion of the fuse metal 3 is electrically connected to the first potential, i.e., $V_{SS}$ (GND) (grounded), and is used as a $V_{SS}$ (GND) node. The other end portion of the fuse metal 3 is electrically connected to a drain 32d of a programming P-channel transistor 32 provided as a first transistor having a channel of the P conductivity type. A node between the fuse metal 3 and the programming P-channel transistor 32 is used as a G node.

The SNODE 5 is electrically connected to a source 32s of the programming P-channel transistor 32. The SET signal (SET) as a first signal is input at a gate 32g of the programming P-channel transistor 32. The programming P-channel transistor 32 is alternatively called SET or breakage P-channel transistor. The SNODE 5 is additionally electrically connected to a drain 33d of a precharging P-channel transistor 33 provided as a second transistor having a channel of the same P conductivity type as the channel of the programming P-channel transistor 32 serving as the first transistor. Namely, the source 32s of the programming P-channel transistor 32 is electrically connected also to the drain 33d of the precharging P-channel transistor 33. A source 33s of the precharging P-channel transistor 33 is electrically connected to $V_{DD}$ (power source potential) defined as the second potential, which is higher than $V_{SS}$ (GND) defined as the first potential. In addition, the precharge signal PRC defined as the second signal, which is different from the first signal SET, is input at a gate 33g of the precharging P-channel transistor 33. The precharging P-channel transistor 33 is provided to precharge the SNODE 5.

Further, as shown in FIG. 6, the SNODE 5 is additionally electrically connected to an input 37i of a first inverter 37. The first inverter 37 is configured as a CMOS inverter formed of a P-channel transistor 35 (PMOS transistor) which is defined as a third transistor and a N-channel transistor 36 (NMOS transistor) that are electrically interconnected.

Respective gates 35g and 36g of the P-channel transistor 35 and the N-channel transistor 36 are both electrically connected to the SNODE 5. The individual gates 35g and 36g are used as the input 37i of the first inverter 37. A drain 35d of the P-channel transistor 35 and a drain 36d of the N-channel transistor 36 are electrically interconnected. The individual drains 35d and 36d are used as an output 37o of the first inverter 37. A source 35s of the P-channel transistor 35 is electrically connected to $V_{DD}$ (power source potential). In addition, a source 36s of the N-channel transistor 36 is electrically connected to $V_{SS}$ (GND) (grounded). The output 37o of the first inverter 37 is electrically connected to an input 40i of a second inverter 40.

Similar to the first inverter 37, the second inverter 40 is configured as a CMOS inverter formed of a latch-feedback N-channel transistor 38 (NMOS transistor) and a latch-feedback P-channel transistor 39 (PMOS transistor) which is defined as a forth transistor, that are electrically interconnected. To prevent confusion with the first inverter 37, the second inverter 40 is alternatively called as a feedback inverter. Respective gates 38g and 39g of the latch-feedback N-channel transistor 38 and the latch-feedback P-channel transistor 39 are both electrically connected to the output 37o of the first inverter 37. The individual gates 38g and 39g are used as the input 40i of the second inverter 40. A drain 38d of the latch-feedback N-channel transistor 38 and a drain 39d of the latch-feedback P-channel transistor 39 are electrically interconnected. The individual drains 38d and 39d are used as an output 40o of the second inverter 40. The output 40o of the second inverter 40 is electrically connected to the SNODE 5. Additionally, the output 40o of the second inverter 40 is electrically connected to the input 37i of the first inverter 37 through the SNODE 5.

Thus, the first inverter 37 and the second inverter 40 together form a latch circuit 41 serving as a storage circuit through the SNODE 5. The latch circuit 41 is electrically connected through the SNODE 5 to the source 32s which is one of the ends (the source 32s and drain 32d of the programming P-channel transistor 32) to which the fuse metal 3 is not connected.

A source 39s of the latch-feedback P-channel transistor 39 is electrically connected to $V_{DD}$ (power source voltage). In addition, a source 38s of the latch-feedback N-channel transistor 38 is electrically connected to a drain 42d of another N-channel transistor 42. The precharge signal PRC is input at a gate 42g of the N-channel transistor 42. Further, a source 42s of the N-channel transistor 42 is electrically connected to $V_{SS}$ (GND) (grounded). The N-channel transistor 42 is provided to function such that while PRC is activated and the SNODE 5 is being precharged, the latch-feedback N-channel transistor 38 is invalidated thereby to restrain a leakage current from flowing to the SNODE 5.

The potential on the side of the output 37o of the first inverter 37 serves as an F node indicative of an output value of the semiconductor integrated circuit (ROM) 31 wherein the fuse metal 3 is programmed by being fuse-blown. Although not shown, in the semiconductor integrated circuit 31, $V_{DD}$ is fed to individual back biases of the P-channel transistors 32, 33, 35, and 39; and $V_{SS}$ is fed to individual back biases of the N-channel transistors 36, 38, and 42.

As described above, according to the fourth embodiment, effects equivalent to those of the first embodiment can be obtained.

The semiconductor integrated circuit of the present invention is not restricted by the individual first to fourth embodiments described above. The present invention may be practiced in such a manner that the configurations of the embodiments or some of manufacturing processes therefor are altered to a variety of settings, or various settings are suitably and appropriately combined example, within a range not departing from the spirit and scope of the present invention.

For example, no limitations are imposed on the occurrence of only one of the gate-source (diffusion layer) breakage and source (diffusion layer)-well breakage described in the first embodiment. The two types of source (diffusion layer) breakage may be caused at one time with one time of irradiation with the laser beam 2. Alternately, the two types of source (diffusion layer) breakage may be continually caused with at least two times of irradiation with the laser beam 2.

Whereas the individual first to fourth embodiments have been described that the source/drain regions of the semiconductor integrated circuits 1, 21, and 31 are formed of the N+ diffusion layer, no limitations are imposed thereon. For example, the source/drain regions may be formed of silicide to allow electrically connecting electrodes to the regions.

The techniques for driving the semiconductor integrated circuit to stably function, as described in the second and third embodiments may be adapted not only to the semiconductor integrated circuit 1 of the first embodiment, but also to the semiconductor integrated circuit 31 of the fourth embodiment.

Further, as long as operations and effects equivalent to those of the semiconductor integrated circuits 1, 21, and 31 of the first to fourth embodiments can be obtained, the conductivity type of the substrate, the conductivity types of the individual transistors, the values of potentials to be applied to the sources/drains of the transistors and the fuse metal, and the types of signals to be input at the gates of the transistors may of course be suitably and appropriately altered and combined.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
 a laser beam irradiation object provided above a substrate, the laser beam irradiation object having one end portion at which a first potential is applied, and having conduction being cut off upon irradiation with a laser beam;
 a first transistor which is provided on the substrate and has a source and a drain, wherein one of the source and the drain is electrically connected to the other end portion of the laser beam irradiation object, the first transistor being supplied with a second potential as a back bias which is different from the first potential, and having a channel formed of a first conductive type;
 a second transistor which has a source and a drain, wherein one of the source and the drain of the first transistor, which is electrically not connected to the other end portion of the laser beam irradiation object, is electrically connected to one of the source and the drain of the second transistor and the second potential is supplied to the other one of the source and the drain of the second transistor, the second transistor being supplied with the second potential as a back bias, and having a channel formed of the first conductive type; and a storage circuit which is electrically connected to the one of the source and the drain of the second transistor to which the first transistor is electrically connected, and which is additionally electrically connected to the one of the source and the drain of the first transistor to which the other end portion of the laser beam irradiation object is not electrically connected; and wherein the first transistor and the second transistor are both N-channel transistors each having a channel of an N type as the first conductive type, $V_{DD}$ is supplied as the first potential to the one end portion of the laser beam irradiation object, and $V_{SS}$ is supplied as the second potential to the individual back biases for the first transistor and the second transistor and to the source of the second transistor, the other end portion of the laser beam irradiation object is electrically connected to the drain of the first transistor, the source of the first transistor is electrically connected to the drain of the second transistor, and the storage circuit is individually electrically connected to the source of the first transistor and the drain of the second transistor, and in any of a case where the conduction of the laser beam irradiation object is cut off and a case where breakage is caused between the source of the first transistor and at least one of a gate of the first transistor and the substrate, a potential of the gate of the first transistor is set to the $V_{SS}$ defined as the second potential.

2. The semiconductor integrated circuit according to claim 1, wherein potentials in a connecting portion of the first transistor, the second transistor, and the storage circuit are the same in a case where the conduction of the laser beam irradiation object is cut off by irradiation with the laser beam and in a case where breakage is caused by irradiation with the laser beam between the one of the source and the drain of the first transistor to which the other end portion of the laser beam irradiation object is not connected and at least one of a gate of the first transistor and the substrate.

3. The semiconductor integrated circuit according to claim 1, wherein a first signal is input to the gate of the first transistor, and a second signal different from the first signal is input at a gate of the second transistor, and the storage circuit has a first inverter wherein an input electrically connected to the source of the first transistor, and a second inverter wherein an output of the first inverter is electrically connected to an input and an output is electrically connected to the source of the first transistor.

4. The semiconductor integrated circuit according to claim 1, wherein a gate oxide film of the first transistor is formed to be thicker than gate oxide films of the individual transistors other than the first transistor, the individual transistors each having a channel formed of the first conductive type.

5. The semiconductor integrated circuit according to claim 1, wherein the laser beam irradiation object is arranged above the first transistor.

6. The semiconductor integrated circuit according to claim 1, wherein the $V_{DD}$ is a power source potential, and the $V_{SS}$ is a ground potential.

7. The semiconductor integrated circuit according to claim 1, wherein a first signal is input to the gate of the first transistor, and a second signal different from the first signal is input at a gate of the second transistor, and the storage circuit has a first inverter wherein an input electrically connected to the source of the first transistor, and a second inverter wherein an output of the first inverter is electrically connected to an input and an output is electrically connected to the source of the first transistor.

8. The semiconductor integrated circuit according to claim 1, wherein a gate oxide film of the first transistor is formed to be thicker than gate oxide films of the individual transistors other than the first transistor, the individual transistors each having a channel formed of the first conductive type.

9. The semiconductor integrated circuit according to claim 1, wherein the laser beam irradiation object is arranged above the first transistor.

10. The semiconductor integrated circuit according to claim 3, wherein a set signal is input as the first signal to the gate of the first transistor, and a precharge signal is input as the second signal to the gate of the second transistor.

11. The semiconductor integrated circuit according to claim 3, wherein an impurity concentration of each of channels of the first transistor and a third transistor constituting the first inverter and having a channel formed of the first conductive type is set lower than an impurity concentration of each of channels of the second transistor and a fourth transistor constituting the second inverter and having a channel formed of the first conductive type.

12. The semiconductor integrated circuit according to claim 3, wherein a gate oxide film of the first transistor is formed to be thicker than gate oxide films of the individual transistors other than the first transistor, the individual transistors each having a channel formed of the first conductive type.

13. The semiconductor integrated circuit according to claim 3, wherein the laser beam irradiation object is arranged above the first transistor.

14. The semiconductor integrated circuit according to claim 4, wherein the set signal to be input to the gate of the first transistor is caused to transition at a potential higher than a range of from 0 to $V_{DD}$.

15. The semiconductor integrated circuit according to claim 1, wherein the first transistor to which the laser beam irradiation object is connected, is connected to the storage circuit through a single current path, and only the laser beam irradiation object is connected to the single current path.

16. A semiconductor integrated circuit comprising:

a laser beam irradiation object provided above a substrate, the laser beam irradiation object having one end portion at which a first potential is applied, and having conduction being cut off upon irradiation with a laser beam;

a first transistor which is provided on the substrate and has a source and a drain wherein one of the source and the drain to which the other end portion of the laser beam irradiation object is electrically connected, the first transistor being supplied with a second potential as a back bias which is different from the first potential, and having a channel formed of a first conductive type;

a second transistor which has a source and a drain wherein one of the source and the drain of the first transistor to which the other end portion of the laser beam irradiation object is not electrically connected is electrically connected to one of the source and the drain of the second transistor and the second potential is supplied to the other one of the source and the drain of the second transistor, the second transistor being supplied with the second potential as a back bias, and having a channel formed of the first conductive type; and a storage circuit which is electrically connected to the one of the source and the drain of the second transistor to which the first transistor is electrically connected, and which is additionally electrically connected to the one of the source and the drain of the first transistor to which the other end portion of the laser beam irradiation object is not electrically connected; and wherein the first transistor and the second transistor are both P-channel transistors each having a channel of a P type as the first conductive type, $V_{SS}$ is supplied as the first potential to the one end portion of the laser beam irradiation object, and $V_{DD}$ is supplied as the second potential to the individual back biases for the first transistor and the second transistor and to the source of the second transistor, the other end portion of the laser beam irradiation object is electrically connected to the drain of the first transistor, the source of the first transistor is electrically connected to the drain of the second transistor, and the storage circuit is individually electrically connected to the source of the first transistor and the drain of the second transistor, and in any of a case where the conduction of the laser beam irradiation object is cut off and a case where breakage is caused between the source of the first transistor and at least one of a gate of the first transistor and the substrate, a potential of the gate of the first transistor is set to the VDD defined as the second potential.

17. The semiconductor integrated circuit according to claim 16, wherein potentials in a connecting portion of the first transistor, the second transistor, and the storage circuit are the same in a case where the conduction of the laser beam irradiation object is cut off by irradiation with the laser beam and in a case where breakage is caused by irradiation with the laser beam between the one of the source and the drain of the first transistor to which the other end portion of the laser beam irradiation object is not connected and at least one of a gate of the first transistor and the substrate.

18. The semiconductor integrated circuit according to claim 16, wherein a first signal is input to the gate of the first transistor, and a second signal different from the first signal is input at a gate of the second transistor, and the storage circuit has a first inverter wherein an input electrically connected to the source of the first transistor, and a second inverter wherein an output of the first inverter is electrically connected to an input and an output is electrically connected to the source of the first transistor.

19. The semiconductor integrated circuit according to claim 16, wherein a gate oxide film of the first transistor is formed to be thicker than gate oxide films of the individual transistors other than the first transistor, the individual transistors each having a channel formed of the first conductive type.

20. The semiconductor integrated circuit according to claim 16, wherein the laser beam irradiation object is arranged above the first transistor.

21. The semiconductor integrated circuit according to claim 16, wherein the $V_{DD}$ is a power source potential and the $V_{SS}$ is a ground potential.

22. The semiconductor integrated circuit according to claim 16, wherein a first signal is input to the gate of the first transistor, and a second signal different from the first signal is input at a gate of the second transistor, and the storage circuit has a first inverter wherein an input electrically connected to the source of the first transistor, and a second inverter wherein an output of the first inverter is electrically connected to an input and an output is electrically connected to the source of the first transistor.

23. The semiconductor integrated circuit according to claim 16, wherein a gate oxide film of the first transistor is formed to be thicker than gate oxide films of the individual transistors other than the first transistor, the individual transistors each having a channel formed of the first conductive type.

24. The semiconductor integrated circuit according to claim 16, wherein the laser beam irradiation object is arranged above the first transistor.

25. The semiconductor integrated circuit according to claim 18, wherein a set signal is input as the first signal to the gate of the first transistor, and a precharge signal is input as the second signal to the gate of the second transistor.

26. The semiconductor integrated circuit according to claim 18, wherein an impurity concentration of each of channels of the first transistor and a third transistor constituting the first inverter and having a channel formed of the first conductive type is set lower than an impurity concentration of each of channels of the second transistor and a fourth transistor constituting the second inverter and having a channel formed of the first conductive type.

27. The semiconductor integrated circuit according to claim 18, wherein a gate oxide film of the first transistor is formed to be thicker than gate oxide films of the individual transistors other than the first transistor, the individual transistors each having a channel formed of the first conductive type.

28. The semiconductor integrated circuit according to claim 18, wherein the laser beam irradiation object is arranged above the first transistor.

29. The semiconductor integrated circuit according to claim 19, wherein
the set signal to be input to the gate of the first transistor is caused to transition at a potential higher than a range of from 0 to $V_{DD}$.

30. The semiconductor integrated circuit according to claim 16, wherein
the first transistor to which the laser beam irradiation object is connected, is connected to the storage circuit through a single current path, and only the laser beam irradiation object is connected to the single current path.

* * * * *